US010295616B2

(12) United States Patent
Goodson et al.

(10) Patent No.: US 10,295,616 B2
(45) Date of Patent: May 21, 2019

(54) MAGNETIC FIELD IMAGING SYSTEM

(71) Applicant: INNOVAURA CORPORATION, Edmonds, WA (US)

(72) Inventors: David B. Goodson, Bellevue, WA (US); Keith Mullins, Kent, WA (US); Alan Corwin, Bremerton, WA (US); Ronald J. Schoenberg, Burien, WA (US); C. Macgill Lynde, Bellevue, WA (US); Christopher A. Wiklof, Everett, WA (US)

(73) Assignee: INNOVAURA CORPORATION, Edmonds, WA (US)

( * ) Notice: Subject to any disclaimer, the term of this patent is extended or adjusted under 35 U.S.C. 154(b) by 520 days.

(21) Appl. No.: 14/769,908

(22) PCT Filed: Mar. 12, 2014

(86) PCT No.: PCT/US2014/025107
§ 371 (c)(1),
(2) Date: Aug. 24, 2015

(87) PCT Pub. No.: WO2014/165292
PCT Pub. Date: Oct. 9, 2014

(65) Prior Publication Data
US 2016/0370441 A1 Dec. 22, 2016

Related U.S. Application Data

(60) Provisional application No. 61/778,326, filed on Mar. 12, 2013.

(51) Int. Cl.
G01R 33/10 (2006.01)
G01R 33/00 (2006.01)

(52) U.S. Cl.
CPC .......... *G01R 33/10* (2013.01); *G01R 33/0023* (2013.01)

(58) Field of Classification Search
CPC ........................... G01R 33/10; G01R 33/0023
See application file for complete search history.

(56) References Cited

U.S. PATENT DOCUMENTS 4,969,469 A 11/1990 Mills
5,018,724 A 5/1991 Naser et al.
(Continued)

FOREIGN PATENT DOCUMENTS

CN 1442703 9/2003
CN 201229821 4/2009
(Continued)

OTHER PUBLICATIONS

PCT International Search Report and Written Opinion of International PCT Application No. PCT/US2014/025107 dated Jul. 14, 2014.
(Continued)

Primary Examiner — Patrick Assouad
Assistant Examiner — Haidong Zhang
(74) Attorney, Agent, or Firm — Christopher A. Wiklof; Nicholas S. Bromer; Launchpad IP, Inc.

(57) ABSTRACT

According to embodiments, multi-axis magnetic sensors (magnetometers) are disposed in an array or a plurality of arrays. The magnetic sensors can be disposed on modules that form the array. The magnetic sensors can each sense a local magnetic field coincident with the respective sensors. Data corresponding to the local magnetic fields can be analyzed by a magnetic field analysis circuit and assembled to form an image corresponding to the sensed magnetic field(s). The magnetic field analysis circuit can output the image corresponding to near-field magnetic features.

46 Claims, 5 Drawing Sheets

(56) References Cited

U.S. PATENT DOCUMENTS

| | | | |
|---|---|---|---|
| 5,418,460 A * | 5/1995 | Cloutier | G01R 33/0206 324/207.17 |
| 5,444,373 A | 8/1995 | Johnson et al. | |
| 6,169,963 B1 | 1/2001 | Markov | |
| 6,195,576 B1 | 2/2001 | John | |
| 6,208,884 B1 | 3/2001 | Kumar et al. | |
| 6,534,977 B1 | 3/2003 | Duncan et al. | |
| 6,665,553 B2 | 12/2003 | Kandori et al. | |
| 6,681,131 B2 | 1/2004 | Kandori et al. | |
| 6,731,968 B2 | 5/2004 | Buchanan | |
| 6,812,690 B2 | 11/2004 | De Jong et al. | |
| 6,888,353 B1 * | 5/2005 | Wiegert | G01V 3/15 324/244 |
| 7,515,777 B2 | 4/2009 | Kuo et al. | |
| 7,560,920 B1 * | 7/2009 | Ouyang | G01N 27/902 324/240 |
| 7,720,740 B2 | 6/2010 | Kraus, Jr. et al. | |
| 7,902,820 B2 | 3/2011 | Vervaeke et al. | |
| 8,106,666 B2 | 1/2012 | Ahmed et al. | |
| 2003/0199749 A1 | 10/2003 | Lowery, Jr. et al. | |
| 2004/0089812 A1 * | 5/2004 | Favro | G01N 3/60 250/341.6 |
| 2004/0124836 A1 | 7/2004 | Kang et al. | |
| 2004/0228100 A1 * | 11/2004 | Wright | H05K 1/0224 361/794 |
| 2004/0232912 A1 | 11/2004 | Tsukamoto et al. | |
| 2004/0253874 A1 | 12/2004 | Plishner | |
| 2005/0106758 A1 | 5/2005 | Fukumoto et al. | |
| 2006/0103380 A1 | 5/2006 | Kochergin et al. | |
| 2007/0038067 A1 | 2/2007 | Kandori et al. | |
| 2007/0046287 A1 | 3/2007 | Vervaeke et al. | |
| 2008/0164875 A1 | 7/2008 | Haworth et al. | |
| 2009/0203988 A1 | 8/2009 | Phua et al. | |
| 2010/0145657 A1 | 6/2010 | Kavusi et al. | |
| 2010/0282973 A1 | 11/2010 | Schulz | |
| 2011/0163740 A1 * | 7/2011 | Russell | G01B 7/10 324/220 |
| 2012/0206139 A1 | 8/2012 | Schulz et al. | |
| 2012/0209546 A1 | 8/2012 | Vervaeke | |

FOREIGN PATENT DOCUMENTS

| | | |
|---|---|---|
| CN | 100516879 | 7/2009 |
| CN | 202383273 | 8/2012 |
| DE | 19948618 | 5/2001 |
| WO | WO 2006/062275 | 6/2006 |

OTHER PUBLICATIONS

EPO Extended Search Report and Search Opinion of EP Application No. 14780100.5 dated Jan. 25, 2017.

* cited by examiner

CHRISTMAS TREE, LEFT END
CALIBRATION STUDY

CHRISTMAS TREE, RIGHT END
CALIBRATION STUDY

MAGNETIC FIELD IMAGING SYSTEM

CROSS-REFERENCE TO RELATED APPLICATIONS

The present application is a U.S. National Phase application under 35 U.S.C. 371 of co-pending International Patent Application No. PCT/US2014/025107, entitled, "MAGNETIC FIELD IMAGING SYSTEM," filed Mar. 12, 2014; which application claims the benefit of U.S. Provisional Patent Application No. 61/778,326, entitled "MAGNETIC SENSOR", filed Mar. 12, 2013; each of which, to the extent not inconsistent with the disclosure herein, is incorporated herein by reference.

SUMMARY

According to an embodiment, a magnetic field imager includes a sensor substrate including a top surface and a bottom surface, a plurality of magnetic sensors arranged in an array and disposed below or on the bottom surface of the sensor substrate, and a microcontroller disposed on the sensor substrate and configured to control sensing by the plurality of magnetic sensors. A data interface is operatively coupled to the microcontroller and configured to enable data communications between the microcontroller and a magnetic field analysis circuit.

According to an embodiment, a method for generating an image corresponding to a magnetic field includes operating a plurality of magnetic sensors in a magnetic sensor array to generate a respective plurality of data values corresponding to a magnetic field strength coincident with each of the magnetic sensors, transferring the plurality of data values to a magnetic field analysis circuit, generating, with the magnetic field analysis circuit, a magnetic field image corresponding to the plurality of data values, and outputting the magnetic field image.

DETAILED DESCRIPTION

Figure 1:
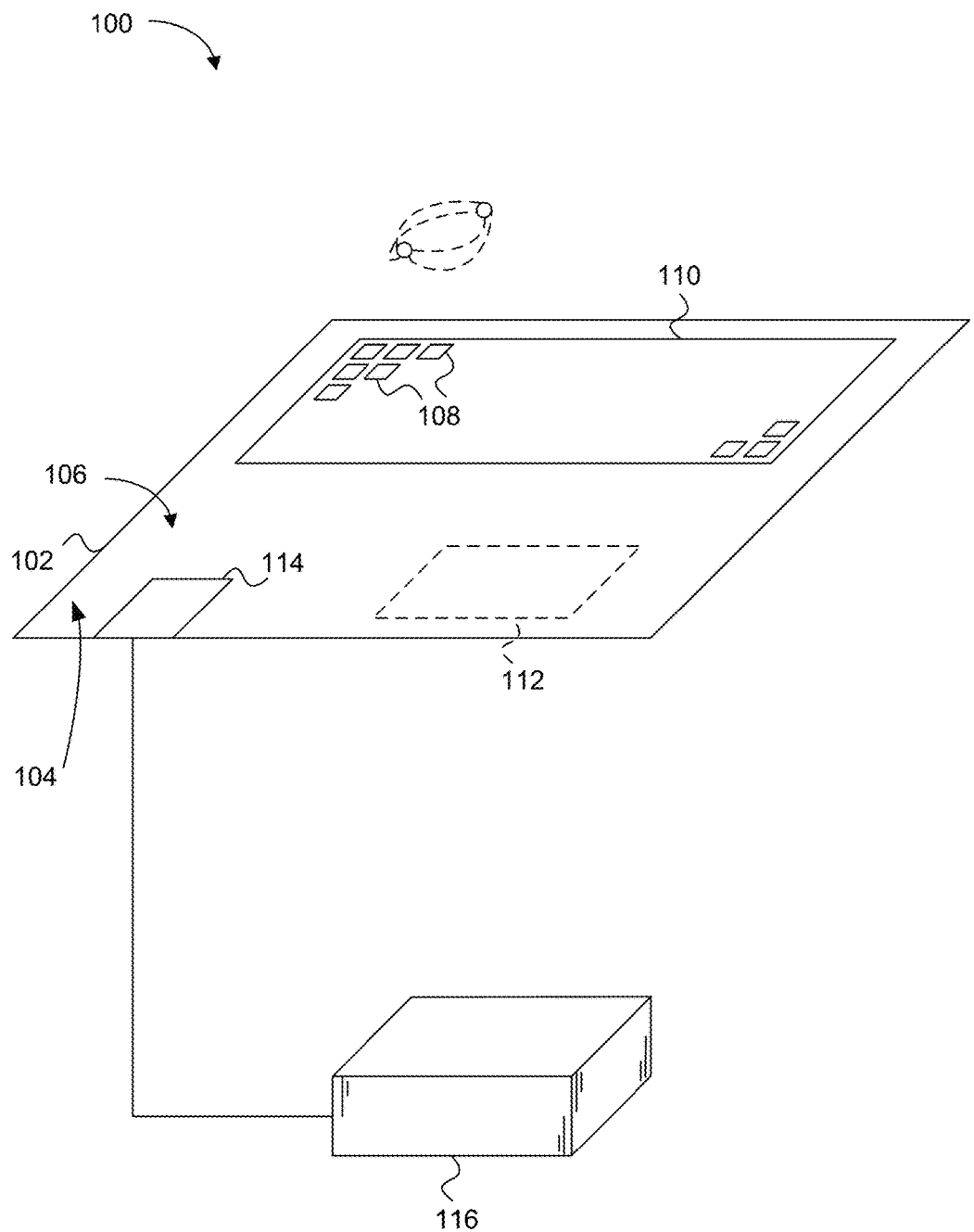
FIG. 1 is a diagram of a magnetic field imager, according to an embodiment.

In the following detailed description, reference is made to the accompanying drawings, which form a part hereof. In the drawings, similar symbols typically identify similar components, unless context dictates otherwise. Other embodiments may be used and/or other changes may be made without departing from the spirit or scope of the disclosure.

The terms "top surface" and "bottom surface" are relative, as used herein. The sensor substrate can be tipped on edge, for example, which will cause the bottom surface to be on one side of the substrate and the top surface to be on the opposite side of the substrate. Generally speaking, the term "bottom surface" refers to a surface that is intended to point toward a source of magnetic fields, and the term "top surface" refers to a surface that is intended to point away from the source of magnetic fields. In automated circuit test equipment (ATE) systems, the tested circuit boards are presented horizontally to a magnetic imaging system that "looks" downward toward the circuit board under test, hence the choice of terminology. For purposes of scope determination, it is the intent of the inventors for the terms "top surface" and "bottom surface" (and related terms such as "above" and "below") to be interpreted generically as opposite surfaces of the substrate that are intended to respectively point away from and toward a source of magnetic fields to be detected and expressed for visualization or further processing.

The term "magnetic field image", as use herein refers to a graphical representation of magnetic field strengths passing through and across each of several magnetometers disposed in a magnetic sensor array. Illustrative graphical illustrations include a surface map or a heat map. The magnetic field image can be generated using a spline function to create a continuous image spanning gaps between the magnetic sensors in the array.

FIG. 1 is a diagram of a magnetic field imager 100, according to an embodiment. The magnetic field imager 100 includes a sensor substrate 102. The sensor substrate 102 defines a top surface 104 and a bottom surface 106. A plurality of magnetic sensors 108 are arranged in an array 110. The plurality of magnetic sensors 108 can be disposed below or on the bottom surface 106 of the sensor substrate 102. In one embodiment, the plurality of magnetic sensors includes a plurality of scalar magnetometers. In another embodiment, the plurality of magnetic sensors includes a plurality of vector magnetometers.

A microcontroller 112 can also be disposed on the sensor substrate 102. The microcontroller 112 is configured to control sensing by the plurality of magnetic sensors 108. A data interface 114 is operatively coupled to the microcontroller 112 and configured to provide a data communications interface between the microcontroller 112 and a magnetic field analysis circuit 116.

The magnetic field imager 100 can be configured to operate without cryogenic cooling. For example, the magnetic field imager 100 can be configured to operate at normal indoor ambient conditions with no cooling, with only conductive cooling, with only convective cooling, or with only conductive and convective cooling.

Various types of magnetic sensors 108 can be used in the magnetic sensor array 110. Generally, the magnetic sensors 108 operate as magnetometers, and can be configured as scalar or vector (e.g. 3-axis) magnetometers. Magnetic sensor technology may be selected according to system requirements for sensitivity, capture time, cost, and sensor density, for example.

According to various embodiments, the magnetic sensors 108 can include spintronic sensors, spin-exchange relaxation-free (SERF) magnetometers, magneto-resistive sensors, magneto-inductive sensors, fluxgate magnetometers, and/or Hall effect magnetometers. According to embodiments, the magnetic sensors 108 include non-cryogenically cooled sensors that have magnetic field sensitivity at least two orders of magnitude below the strength of the earth's magnetic field.

Figure 2:
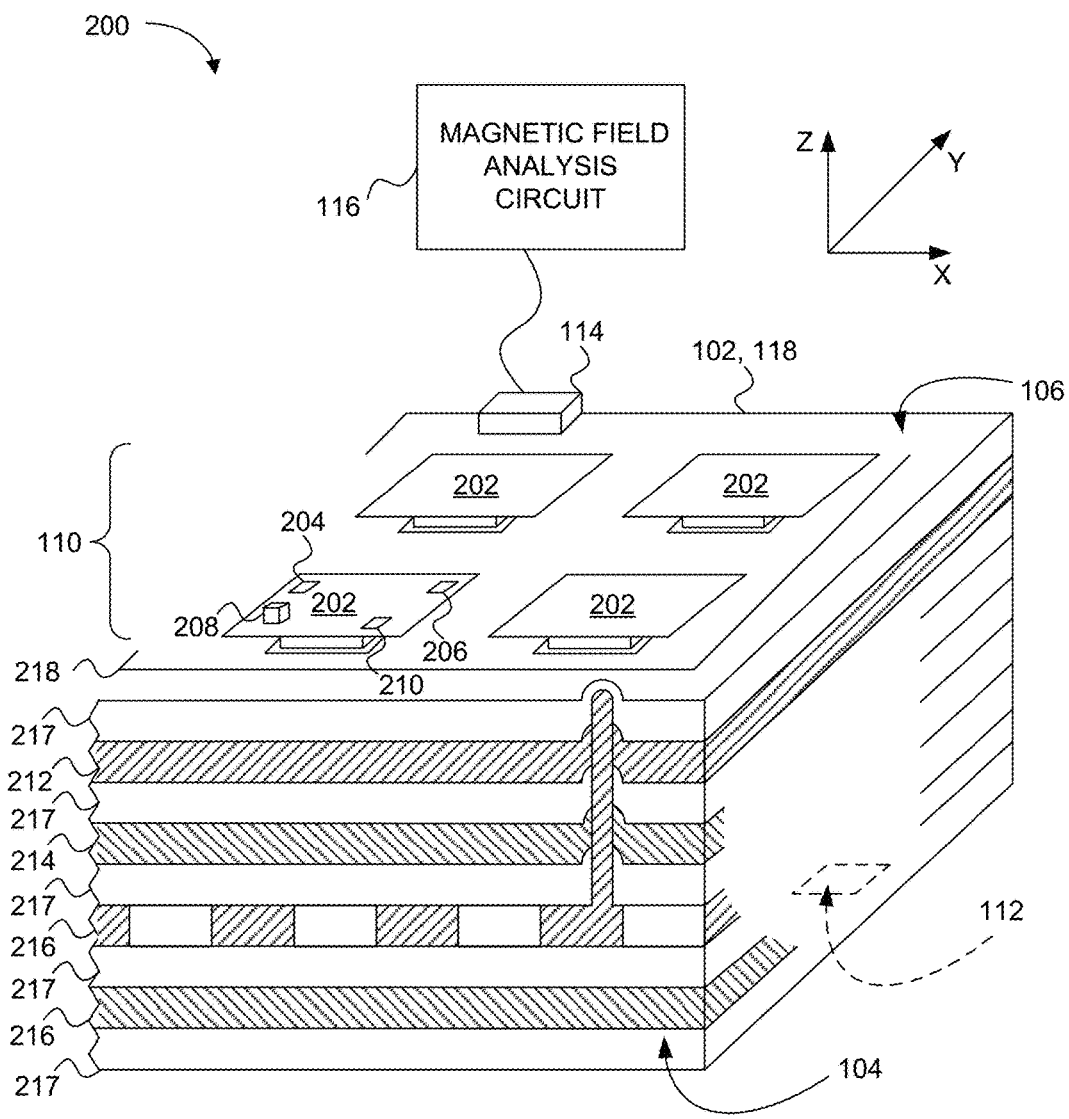
FIG. 2 is a side sectional view of an embodiment the magnetic field sensor of FIG. 1, according to an embodiment.

FIG. 2 is a side sectional view of an embodiment 200 the magnetic field sensor of FIG. 1, according to an embodiment. The sensor substrate 102 can include a printed circuit board 118. The microcontroller 112 can be disposed on the top surface 104 of the printed circuit board 118. The plurality of magnetic sensors 108 can be disposed on or near the bottom of the printed circuit board 118 for sensing near field electromagnetic features below and can be spaced away from the bottom of the printed circuit board 118.

The plurality of magnetic sensors 108 can be disposed in a plurality of sensor modules 202 that are physically coupled to the bottom of the printed circuit board 118. Each of at least a portion of the plurality of sensor modules 202 can include a sensor module. The sensor module can be configured to sense a local magnetic field responsive to a magnetic field along at least three axes. Each of the plurality of sensor modules 202 can include an X-axis magnetic sensor 204, a Y-axis magnetic sensor 206, a Z-axis magnetic sensor 208, and an integrated circuit controller 210. The integrated circuit controller 210 can include an application-specific integrated circuit (ASIC) or other programmable circuit. The application-specific integrated circuit (ASIC) or other programmable circuit can be configured to interface to the microcontroller 112 and to a plurality of magnetic sensors 204, 206, 208 on the sensor module.

For example, each sensor module can be a model RM3000F sensor module produced by PNI Sensor Corporation of Santa Rosa, Calif., USA. In another example, each sensor module can be a magnetic sensor module available from Freescale Semiconductor Inc. of Austin, Tex., USA. In another example, each sensor module can be a magnetic sensor module such as model LIS3MDL available from STMicroelectronics of Geneva, Switzerland.

The sensor substrate 102 can include a ground plane 212 disposed above the array of magnetic sensors. A power plane 214 can be disposed above the ground plane 212. One or more signal planes 216 can be disposed above the power plane 214. Insulation layers 217 are typically disposed on the surfaces of the sensor substrate 102 and between conductive layers 212, 214, 216, 216. At least the ground plane 212 can be configured to shield the array of magnetic sensors from electromagnetic signals conducted from the microcontroller 112.

The magnetic field imager 100 can include a magnetic shield 218 according to an embodiment. The magnetic shield 218 can be disposed below the sensor substrate 102 or on the bottom surface 106 of the sensor substrate 102. The plurality of magnetic sensors 204, 206, 208 can be disposed below the magnetic shield 218. The magnetic shield 218 can include mu-metal. Various magnetic shielding materials can be used in addition to or alternatively to mu-metal. For example, magnetic shielding materials that can be used alone or in combination include Co-Netic, supermalloy, supermumetal, nilomag, sanbold, Molybdenum permalloy, Sendust, M-1040, Hipernom, HyMu-80 and Amumetal.

Referring to FIGS. 1 and 2, the plurality of magnetic sensors 204, 206, 208 can be arranged as sensor modules. Each sensor module can be configured to sense a local magnetic field along a plurality of sensing axes.

The plurality of magnetic sensors 204, 206, 208 can be arranged as a plurality of sensor modules 202. The microcontroller 112 can be configured to cause only one sensor module at a time to operate to sense a respective local magnetic field coincident with each respective sensor module. The microcontroller 112 can be configured to suspend read and write operations when a sensor module is operating to sense the local magnetic field. Additionally or alternatively, the microcontroller 112 can be configured to suspend read and write operations until an operating sensor module toggles an interface pin or until a timeout occurs.

The plurality of magnetic sensors 204, 206, 208 can be arranged as a plurality of sensor modules 202. The microcontroller 112 can be operatively coupled to each sensor module through a serial peripheral interface bus.

The microcontroller 112 can be configured to cause only one magnetic sensor or one group of magnetic sensors out of the plurality of magnetic sensors 204, 206, 208 to detect respective local magnetic fields at a time.

The magnetic imager can be configured to detect an electromagnetic image in about 100 milliseconds or less.

The data interface 114 can include a universal serial bus (usb) port. The magnetic imager can be configured as a peripheral on a usb port. The microcontroller 112 can be configured to disconnect continuity between a data line of the usb port and power or ground received from the usb port when the microcontroller 112 causes a magnetic sensor or magnetic sensor module to detect a local magnetic field.

Disconnecting a data line of the usb port from power or ground can be used to cause a host computer operating as the magnetic field analysis circuit 116 to cease data transmissions across the usb port. This can be useful for reducing the chance of signals conducted from the host computer from interfering with the magnetic field detection.

The array 110 of magnetic sensors 108 can include a 2×2 array size or greater. The magnetic sensors can be arranged in modules, with each module including multiple detection axes. The 2×2 array or greater can include a 2×2 array of modules. Additionally or alternatively, the array of magnetic sensors may include a 4×4 array size or greater.

The microcontroller 112 can include an ARM Cortex M3 with boot ROM and RAM. According to an embodiment, the magnetic imager can include a linear regulator configured to reduce 5V to 3.3V. The linear regulator can be shielded.

A sensor array selector, which may for example include an array of jumpers, can be provided to provide information to the microcontroller 112 about magnetic sensor array characteristics. For example, jumpers can be used to set the array size. This can allow for some sensor modules to not be populated.

The magnetic field analysis circuit 116 can be configured to receive, from the microcontroller 112, a plurality of data values respectively corresponding to a magnetic field strength measured by each of the plurality of magnetic sensors 204, 206, 208 and calculate a magnetic map corresponding to the plurality of data values. For example, the magnetic field analysis circuit 116 can include a general-purpose computer configured to run a magnetic field imaging program. The general-purpose computer can include a tablet computer.

Each of the plurality of data values can include at least one value corresponding to a magnetic field strength along one axis.

Additionally and/or alternatively, each of the plurality of data values can include three values corresponding to a magnetic field strength along each of three axes. The magnetic field analysis circuit 116, when calculating the magnetic map, can be configured to combine the three values forming each of the plurality of data values to generate a corresponding plurality of vector lengths corresponding to magnetic field strengths across the array 110. For example, the values can each be formed as data values b1, b2, and b3.

The data values can be squared and added. A square root can be taken of the sum of the squares to produce a single data value B corresponding to (scalar) local magnetic field strength. According to an alternative embodiment, a single data value B can alternatively be determined as a dot product of the data values b1, b2, and b3. According to an embodiment, each of the data values b1, b2, and b3 can be formed as three bytes of data.

Figure 3A:
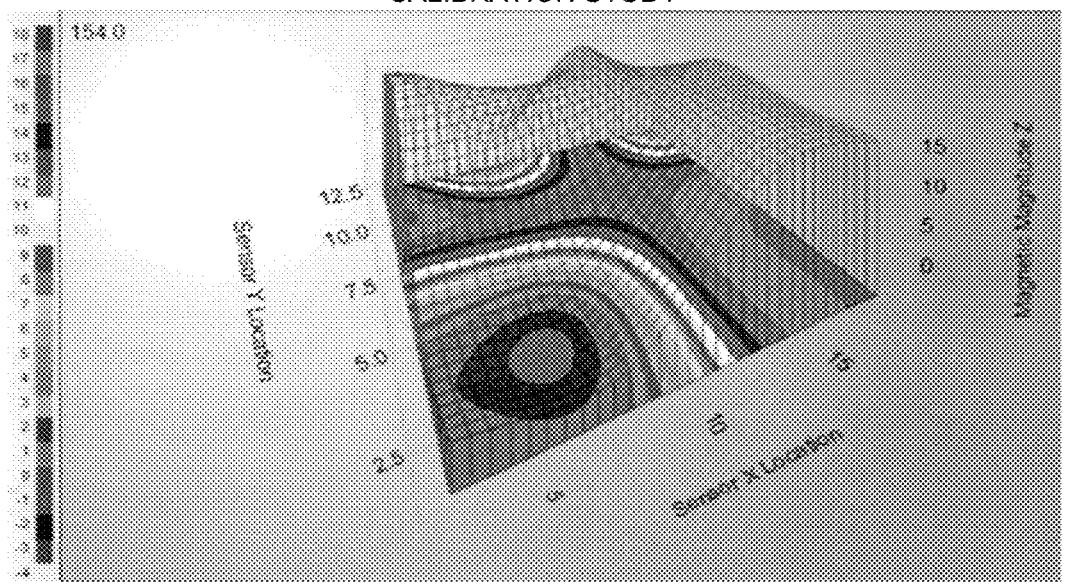
FIG. 3A is a first magnetic map output from the magnetic field analysis circuit of FIG. 1 responsive to a first near field magnetic field pattern, according to an embodiment.
Figure 3B:
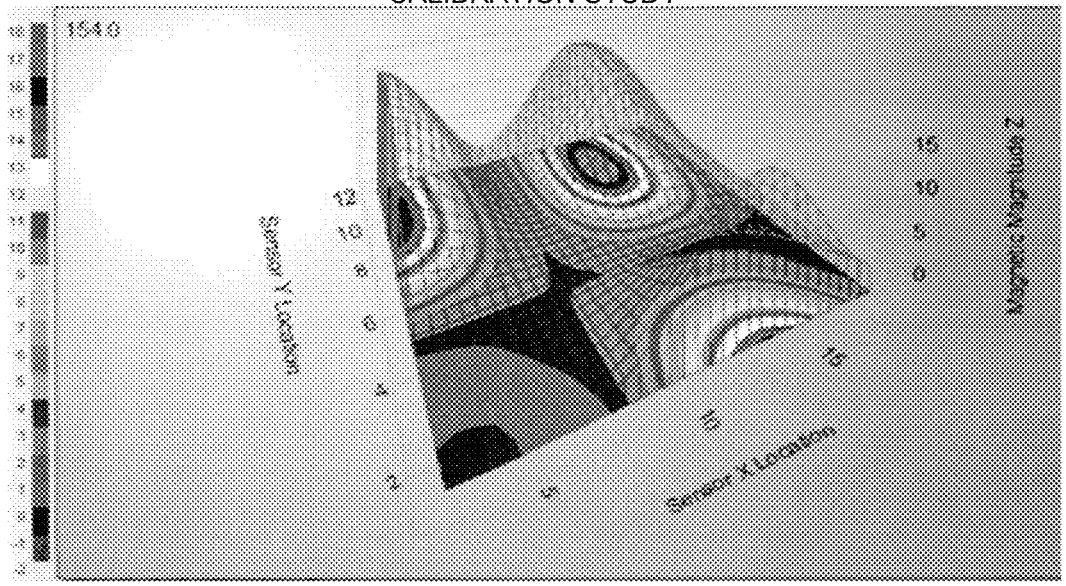
FIG. 3B is a second magnetic map output from the magnetic field analysis circuit of FIG. 1 responsive to a second near field magnetic field pattern, according to an embodiment.

FIG. 3A is a first magnetic map 300 output from the magnetic field analysis circuit 116 of FIG. 1 responsive to a first near field magnetic field pattern, according to an embodiment. FIG. 3B is a second magnetic map 301 output from the magnetic field analysis circuit 116 of FIG. 1 responsive to a second near field magnetic field pattern, according to an embodiment. The magnetic field analysis circuit 116 can be configured to generate a surface map 302a, 302b of the magnetic field strengths across the array 110 using the vector lengths. The magnetic field analysis circuit 116 can be configured to generate the magnetic field image 302a, 302b of the magnetic field strengths using a spline function to interpolate between and smooth the vector lengths.

The magnetic field analysis circuit 116 can be configured to generate a heat map 304a, 304b of the magnetic field strengths across the array 110.

The magnetic field analysis circuit 116 can be configured to output a magnetic field image 302a, 302b or heat map 304a, 304b corresponding to the calculated magnetic map.

Figure 4:
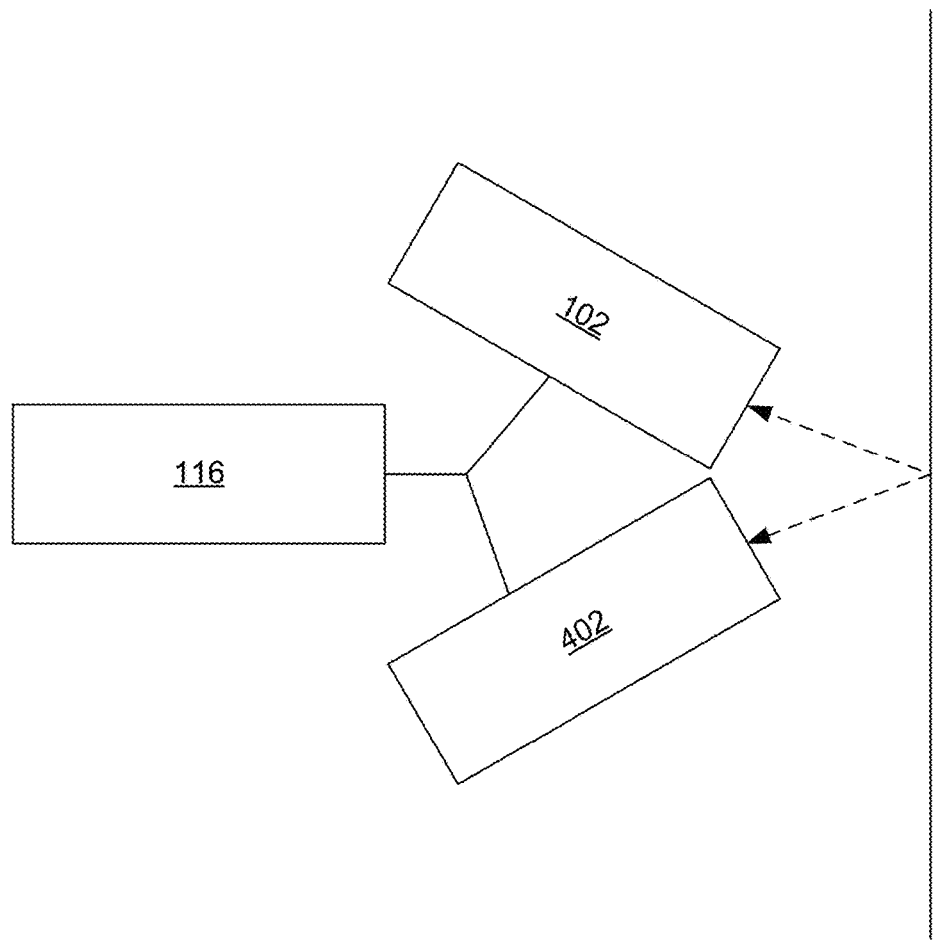
FIG. 4 is a block diagram of a magnetic field imager including an image sensor, according to an embodiment.

FIG. 4 is a block diagram of a magnetic field imager 400 including an image sensor 402, according to an embodiment. The magnetic field imager 400 can include a visible light, ultraviolet light, or infrared light imager 402 registered to the magnetic sensor array and can be operatively coupled to the magnetic field analysis circuit 116. The magnetic field analysis circuit 116 can be configured to output a magnetic field image registered to a visible light, ultraviolet light, or infrared light image produced by the visible light, ultraviolet light, or infrared light imager 402.

Figure 5:
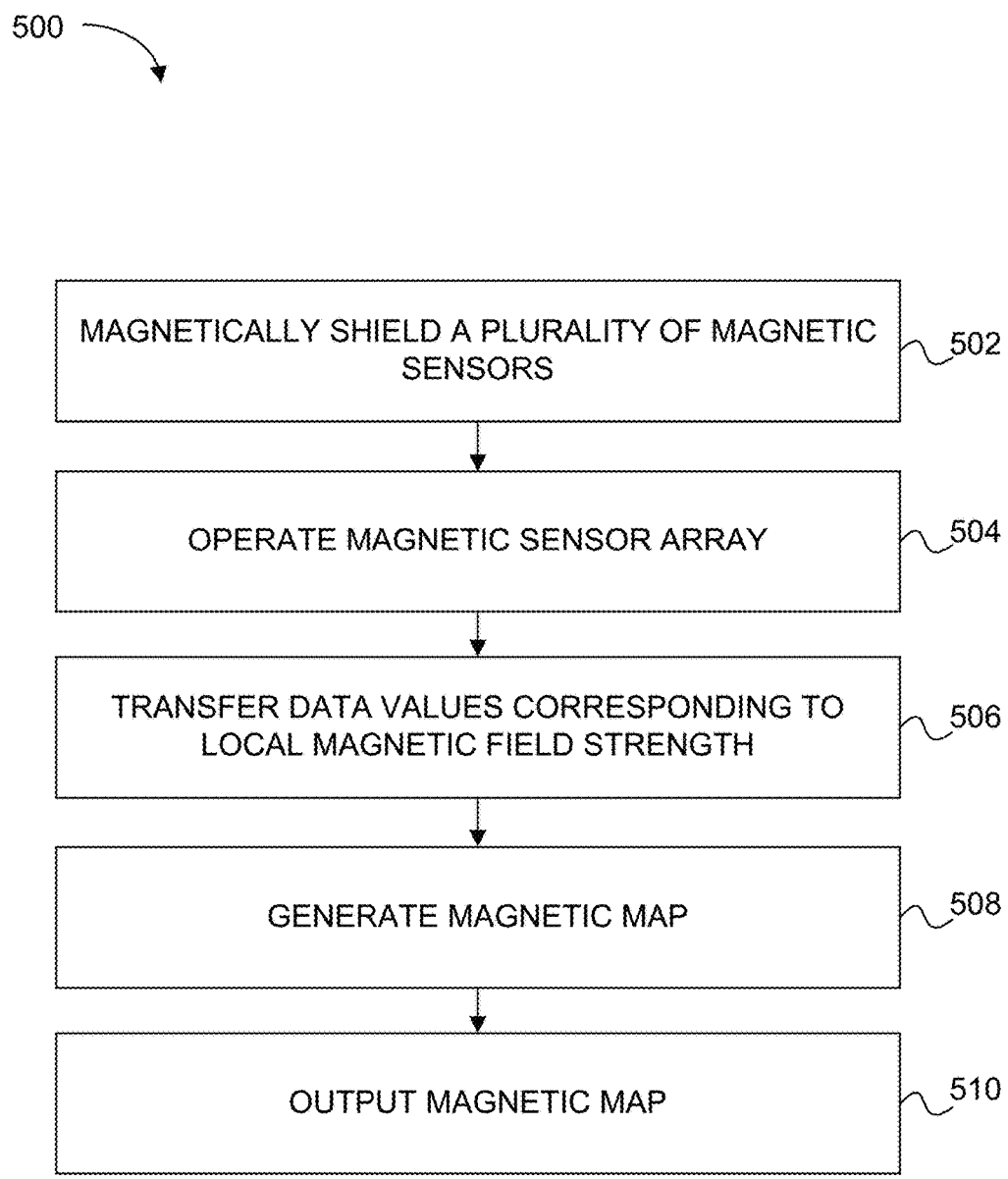
FIG. 5 is a flow chart showing a method for generating an image corresponding to a magnetic field, according to an embodiment.

FIG. 5 is a flow chart showing a method 500 for generating an image corresponding to a magnetic field, according to an embodiment. The method 500 for generating an image corresponding to a magnetic field, includes step 504 a plurality of magnetic sensors are operated in a magnetic sensor array to generate a respective plurality of data values corresponding to a local magnetic field strength coincident with each of the magnetic sensors. In step 506 the plurality of data values are transferred to a magnetic field analysis circuit. Proceeding to step 508, with the magnetic field analysis circuit, a magnetic field image is generated corresponding to the plurality of data values. In step 510 the magnetic field image is output.

The magnetic field analysis circuit can include a general purpose computer configured to execute a magnetic field analysis computer program.

The method 500 for generating an image corresponding to a magnetic field can further include step 502, the plurality of magnetic sensors in the magnetic sensor array can be magnetically shielded from a microcontroller that operates the magnetic sensors.

Magnetically shielding the plurality of magnetic sensors in the magnetic sensor array from the microcontroller that operates the magnetic sensors can include providing the microcontroller on a first side of a magnetic sensor substrate. Magnetically shielding the plurality of magnetic sensors in the magnetic sensor array from the microcontroller that operates the magnetic sensors can include providing signal planes coupled to the microcontroller in the magnetic sensor substrate adjacent to the first side of the magnetic sensor substrate. Magnetically shielding the plurality of magnetic sensors in the magnetic sensor array from the microcontroller that operates the magnetic sensors can include providing the magnetic sensors on or adjacent a second side of the magnetic sensor substrate. In another embodiment, magnetically shielding the plurality of magnetic sensors in the magnetic sensor array from the microcontroller that operates the magnetic sensors can include providing at least one of a power plane or a ground plane adjacent to the second side of the magnetic sensor substrate, between the magnetic sensors and the signal planes.

In step 502, magnetically shielding the plurality of magnetic sensors in the magnetic sensor array from the microcontroller that operates the magnetic sensors can include providing a magnetic shield between the microcontroller and the magnetic sensors. Providing a magnetic shield between the microcontroller and the magnetic sensors can include providing a magnetic shield formed from mu-metal.

In step 504, operating the plurality of magnetic sensors in the magnetic sensor array can include sequentially measuring a local magnetic field coincident with each of the plurality of magnetic sensors.

The method 500 for generating an image corresponding to a magnetic field, can include providing cooling to the magnetic sensor array consisting essentially of conductive cooling, convective cooling, or conductive cooling and convective cooling. In some particular embodiments, providing cooling to the magnetic sensor array does not include providing cryogenic cooling.

Referring to step 504, operating the plurality of magnetic sensors in the magnetic array can include operating each of a plurality of sensor modules to sense respective vector magnetic field components responsive to a (vector) magnetic field along at least three axes per sensor module. In one embodiment, operating each of a plurality of sensor modules to sense respective local magnetic field components responsive to a magnetic field along at least three axes per sensor module can include measuring, for each sensor module and in each of three magnetic sensors on each sensor module, a change in electrical resistance between a fixed pole angle ferromagnetic layer and an induced polarity ferromagnetic and/or paramagnetic layer. The induced polarity can be responsive to a magnetic field strength coincident with each respective magnetic sensor along its corresponding axis. In other embodiments, measuring each magnetic field component (axis) can include operating a fluxgate magnetometer aligned with each axis, operating a magneto-inductive magnetometer aligned with each axis, operating a magneto-resistive magnetometer aligned with each axis, operating a SERF magnetometer aligned with each axis, or operating a Hall effect magnetometer aligned with each axis. The measurements are repeated for each location in the sensor array to provide local magnetic field data coincident with each sensor location in the array.

Operating the plurality of magnetic sensors in the magnetic array can include operating a plurality of X-axis magnetic sensors, a plurality of Y-axis magnetic sensors, and a plurality of Z-axis magnetic sensors. Operating the plurality of magnetic sensors in the magnetic array can include operating equal numbers of X-axis magnetic sensors, Y-axis magnetic sensors, and Z-axis magnetic sensors. Additionally and/or alternatively, operating the plurality of magnetic sensors in the magnetic array can include operating unequal numbers of X-axis magnetic sensors, Y-axis magnetic sensors, and Z-axis magnetic sensors.

Operating the plurality of magnetic sensors in the magnetic array can include operating an application-specific integrated circuit (ASIC) and/or other programmable circuit configured to interface to a plurality of magnetic sensors corresponding to each of a plurality of sensor modules.

Operating a plurality of magnetic sensors in a magnetic sensor array can include operating a plurality of magnetic sensors arranged in sensor modules, each sensor module being configured to sense local magnetic field coincident with each sensor on a plurality of sensing axes.

Operating a plurality of magnetic sensors in a magnetic sensor array can include operating a microcontroller to cause only one sensor module at a time to operate to sense a local magnetic field. Read and write operations with the microcontroller can be suspended when a sensor module is operating to sense the local magnetic field. Suspending read and write operations with the microcontroller when a sensor module is operating can include suspending read and write operations until an operating sensor module toggles an interface pin or until a timeout occurs.

The magnetic imager can be configured to detect an electromagnetic image in about 100 milliseconds or less.

The method 500 can include disconnecting continuity between a data line of a universal serial bus (usb port) operatively coupled to the magnetic field analysis circuit and power or ground received from the usb port when the plurality of magnetic sensors are operating.

Referring to step 504, operating a plurality of magnetic sensors in a magnetic sensor array can include operating a plurality of magnetic sensors in a magnetic sensor array having 2×2 array size or greater. Operating a plurality of magnetic sensors in a magnetic sensor array having 2×2 array size or greater can include operating magnetic sensors arranged in a 2×2 or greater array size of modules, with each module including multiple detection axes. In another embodiment, step 504 can include operating a plurality of magnetic sensors in a magnetic sensor array having 4×4 array size or greater.

Referring to step 508, generating, with the magnetic field analysis circuit, a magnetic field image corresponding to the plurality of data values can include, for each location in the magnetic sensor array, selecting at least one value corresponding to a magnetic field strength along one axis and using the selected value as input to the magnetic field image. Selecting at least one value corresponding to a magnetic field strength along one axis for each location in the magnetic sensor array can include selecting a maximum value of three values corresponding to a magnetic field strength along each of three axes.

In step 508, generating, with the magnetic field analysis circuit, a magnetic field image corresponding to the plurality of data values can include, for each location in the magnetic sensor array, combining data values corresponding to a coincident magnetic field strength along a plurality of axes to determine a magnetic field strength independent of any one axis. In another embodiment, generating, with the magnetic field analysis circuit, a magnetic field image corresponding to the plurality of data values can include, for each location in the magnetic sensor array, squaring a value corresponding to the magnetic field strength along each of three axes, summing the squares, and taking the square root of the sum of the squares. The square root of the sum of the squares can represent a data value corresponding to the vector magnitude of the magnetic field strength.

Step 508 can include, for each location in the magnetic sensor array, calculating a magnetic field strength as a series of computer-executable instructions corresponding to solving the formula:

$$B=\text{sqrt}(b1^{}2+b2^{}2+b3^{**}2); \quad \quad 1)$$

wherein:
B is a scalar value corresponding to local magnetic field strength,
b1 is a scalar value corresponding to local magnetic field strength along a first axis,
b2 is a scalar value corresponding to local magnetic field strength along a second axis orthogonal to the first axis, and
b3 is a scalar value corresponding to local magnetic field strength along a third axis orthogonal to the first and second axes.

The values b1, b2, and b3 can each consist essentially of a data value or converted data value (e.g., decimal equivalent of a binary or hex value) received from a magnetic sensor 108 (e.g., each of the orthogonal sensors 204, 206, and 208) during a single imaged frame.

Alternatively, the values b1, b2, and b3 can be calculated to compensate for a far field magnetic field. In an embodiment, a reference frame can be established by producing (calculating) an image during an interval when no measurable object is present within a field of view corresponding to an extent of the sensor array. "No measurable object" refers to an object intended to be magnetically imaged. In some cases, substantially static near field magnetic poles can be present when the reference frame is measured. This arrangement is preferred when the substantially static near field magnetic poles will be present when objects are presented for magnetic imaging.

When subsequently (or previously) capturing a magnetic image during a time interval when a measured object is present within a field of view corresponding to an extent of the sensor array, each reference frame value $b1_{ref}$, $b2_{ref}$, $b3_{ref}$ is subtracted from a corresponding measured frame value $b1_{meas}$, $b2_{meas}$, $b3_{meas}$ to calculate the data b1, b2, b2 used to determine each scalar field strength B used to determine the magnetic image.

In other words:

$$B=\text{sqrt}(b1^{}2+b2^{}2+b3^{**}2); \quad \quad 2)$$

wherein:
B is a scalar value corresponding to local magnetic field strength, $$b1=b1_{meas}-b1_{ref}, \quad \quad 3)$$

$$b2=b2_{meas}-b2_{ref}, \text{ and} \quad \quad 4)$$

$$b3=b3_{meas}-b3_{ref} \quad \quad 5)$$

wherein the variables are defined as described above.

The series of computer-executable instructions can include floating point operations.

In step 508, generating, with the magnetic field analysis circuit, a magnetic field image corresponding to the plurality of data values can consist essentially of generating a surface map and/or can consist essentially of generating a heat map. In another embodiment, step 508 can include generating a heat map superimposed on a surface map or generating a surface map superimposed over a heat map.

Generating, with the magnetic field analysis circuit, a magnetic field image corresponding to the plurality of data values can include interpolating magnetic field strengths corresponding to locations between the magnetic sensors.

Generating, with the magnetic field analysis circuit, a magnetic field image corresponding to the plurality of data values can include executing a spline function responsive to the data values or a function of the data values.

The method 500 for generating an image corresponding to a magnetic field can include operating a visible light, ultraviolet light, or infrared light imager to capture an image of a near-field object that generates the magnetic field or magnetic fields. The method 500 can include correlating one or more features of the image of the near-field object to the magnetic field or magnetic fields.

The imager can be registered to the magnetic sensor array and can be operatively coupled to the magnetic field analysis circuit.

Outputting the magnetic field image can include outputting a magnetic field image registered to a visible light, ultraviolet light, or infrared light image produced by the visible light, ultraviolet light, and/or infrared light imager.

Methods or portions of methods described herein can be embodied as computer-executable instructions carried by a non-transitory computer readable medium. For example, the non-transitory computer readable medium can include a read-and-write memory circuit (RAM), a read-only memory circuit (ROM), electrically-erasable programmable read-only memory (EEPROM), flash memory, flash memory configured as a universal serial bus (usb) drive, an optical disk such as a CD-RAM, CD-ROM, or DVD disk, or rotating magnetic media.

While various aspects and embodiments have been disclosed herein, other aspects and embodiments are contemplated. The various aspects and embodiments disclosed herein are for purposes of illustration and are not intended to be limiting, with the true scope and spirit being indicated by the following claims.

What is claimed is:

1. A magnetic field imager, comprising:
    a sensor substrate including:
        a top surface and a bottom surface;
        a ground plane;
        a power plane disposed above the ground plane; and
        one or more signal planes disposed above the power plane;
    a plurality of magnetic sensors arranged in an array and disposed below the sensor substrate and the ground plane;
    a microcontroller disposed on the sensor substrate and configured to control sensing by the plurality of magnetic sensors;
    a data interface operatively coupled to the microcontroller and configured to enable data communications between the microcontroller and a magnetic field analysis circuit, wherein at least the ground plane is configured to shield the array of magnetic sensors from electromagnetic signals conducted from the microcontroller; and
    the magnetic field analysis circuit configured to execute a series of computer-executable instructions configured to cause the following formula to be solved:

$B = \sqrt{b1^2 + b2^2 + b3^2}$;

wherein:

$b1 = b1_{meas} - b1_{ref}$, $b2 = b2_{meas} - b2_{ref}$, and $b3 = b3_{meas} - b3_{ref}$;

wherein:
    $b1_{meas}$ is a scalar value corresponding to magnetic field strength along a first axis during a time interval when a measured object is present within a field of view corresponding to an extent of the sensor array,
    $b1_{ref}$ is a scalar value corresponding to magnetic field strength along the first axis during a time interval when no measurable object is present within a field of view corresponding to the extent of the sensor array,
    $b2_{meas}$ is a scalar value corresponding to magnetic field strength along a second axis during a time interval when a measured object is present within a field of view corresponding to an extent of the sensor array,
    $b2_{ref}$ is a scalar value corresponding to magnetic field strength along the second axis during a time interval when no measurable object is present within a field of view corresponding to the extent of the sensor array,
    $b3_{meas}$ is a scalar value corresponding to magnetic field strength along a third axis during a time interval when a measured object is present within a field of view corresponding to an extent of the sensor array, and
    $b3_{ref}$ is a scalar value corresponding to magnetic field strength along the third axis during a time interval when no measurable object is present within a field of view corresponding to the extent of the sensor array.

2. The magnetic field imager of claim 1, wherein plurality of magnetic sensors are disposed on the bottom surface of the sensor substrate.

3. The magnetic field imager of claim 1, wherein the sensor substrate includes a printed circuit board;
    wherein the microcontroller is disposed on the top surface of the printed circuit board; and
    wherein the plurality of magnetic sensors are disposed on or near the bottom of the printed circuit board for sensing near field electromagnetic features below and spaced away from the bottom of the printed circuit board.

4. The magnetic field imager of claim 3, wherein the plurality of magnetic sensors are disposed in a plurality of sensor modules that are physically coupled to the bottom of the printed circuit board.

5. The magnetic field imager of claim 4, wherein each of the plurality of sensor modules includes an X-axis magnetic sensor, a Y-axis magnetic sensor, and a Z-axis magnetic sensor, and wherein the X-axis, the Z-axis, and the Y-axis are mutually substantially perpendicular.

6. The magnetic field imager of claim 4, wherein each of the plurality of sensor modules includes an integrated circuit controller including an application-specific integrated circuit (ASIC) or other programmable circuit configured to interface to the microcontroller and to a plurality of magnetic sensors on the sensor module.

7. The magnetic field imager of claim 1, further comprising:
    a magnetic shield disposed below the sensor substrate or on the bottom surface of the sensor substrate;
    wherein the plurality of magnetic sensors are disposed below the magnetic shield.

8. The magnetic field imager of claim 1, wherein the plurality of magnetic sensors are arranged as a plurality of sensor modules;
    wherein the microcontroller is configured to cause only one sensor module at a time to operate to sense a respective local magnetic field; and
    wherein the microcontroller is configured to suspend read and write operations when a sensor module is operating to sense the local magnetic field.

9. The magnetic field imager of claim 8, wherein the microcontroller is configured to suspend read and write operations until an operating sensor module toggles an interface pin or until a timeout occurs.

10. The magnetic field imager of claim 1, wherein the microcontroller is configured to cause only one magnetic sensor or one group of magnetic sensors at a time out of the plurality of magnetic sensors to detect respective local magnetic fields.

11. The magnetic field imager of claim 1, wherein the data interface includes a universal serial bus (usb) port; and wherein
the microcontroller is configured to disconnect continuity between a data line of the usb port and power or ground received from the usb port when the microcontroller causes a magnetic sensor or magnetic sensor module to detect a local magnetic field.

12. The magnetic field imager of claim 1, wherein the array of magnetic sensors is a square array of magnetometers, wherein each magnetometer in the array includes a module having an X-axis vector magnetometer, a Y-axis vector magnetometer, and a Z-axis vector magnetometer.

13. The magnetic field imager of claim 1, wherein the magnetic field analysis circuit is configured to:
receive, from the microcontroller, a plurality of data values respectively corresponding to a local magnetic field measured by each of the plurality of magnetic sensors; and
calculate a magnetic map corresponding to the plurality of data values; and wherein
wherein each of the plurality of data values includes at least one value corresponding to a local magnetic field strength along one axis.

14. The magnetic field imager of claim 13, wherein each of the plurality of data values includes three values corresponding to a local magnetic field strength along each of three axes.

15. The magnetic field imager of claim 14, wherein the magnetic field analysis circuit, when calculating the magnetic map, is configured to combine the three values forming each of the plurality of data values to generate a corresponding plurality of local scalar magnetic field strengths corresponding to locations of magnetic sensors across the array.

16. The magnetic field imager of claim 15, wherein the magnetic field analysis circuit is further configured to generate a magnetic field image of the magnetic field strengths across the array using the local scalar magnetic field strengths; and
wherein the magnetic field analysis circuit is configured to generate the magnetic field image of the magnetic field strengths using a spline function to interpolate between local scalar magnetic field strengths.

17. The magnetic field imager of claim 15, wherein the magnetic field analysis circuit is further configured to generate a heat map of the local magnetic field strengths across the array.

18. The magnetic field imager of claim 13, wherein the magnetic field analysis circuit is further configured to output a surface map or heat map corresponding to the calculated magnetic map.

19. The magnetic field imager of claim 1, further comprising:
a visible light, ultraviolet light, or infrared light imager registered to the magnetic sensor array and operatively coupled to the magnetic field analysis circuit;
wherein the magnetic field analysis circuit is configured to output a magnetic field image registered to a visible light, ultraviolet light, or infrared light image produced by the visible light, ultraviolet light, or infrared light imager.

20. A method for generating an image corresponding to a magnetic field, comprising:
providing a microcontroller on a first side of a magnetic sensor substrate;
providing signal planes coupled to the microcontroller in the magnetic sensor substrate adjacent to the first side of the magnetic sensor substrate;
providing a plurality of magnetic sensors on or adjacent a second side of the magnetic sensor substrate;
providing at least one of a power plane or a ground plane adjacent to the second side of the magnetic sensor substrate, between the magnetic sensors and the signal planes;
operating the plurality of magnetic sensors in a magnetic sensor array supported by a substrate to generate a respective plurality of data values corresponding to a magnetic field strength coincident with each of the magnetic sensors;
transferring the plurality of data values to a magnetic field analysis circuit;
generating, with the magnetic field analysis circuit, a magnetic field image corresponding to the plurality of data values; and
outputting the magnetic field image via a data interface portion of the magnetic field analysis circuit;
wherein generating, with the magnetic field analysis circuit, a magnetic field image corresponding to the plurality of data values includes, for each location in the magnetic sensor array, calculating a magnetic field strength as a series of computer-executable instructions corresponding to solving the formula:

$$B = \operatorname{sqrt}(b1^2 + b2^2 + b3^2);$$

wherein:

$$b1 = b1_{meas} - b1_{ref},$$

$$b2 = b2_{meas} - b2_{ref}, \text{ and}$$

$$b3 = b3_{meas} - b3_{ref};$$

wherein:
$b1_{meas}$ is a scalar value corresponding to magnetic field strength along a first axis during a time interval when a measured object is present within a field of view corresponding to an extent of the sensor array,
$b1_{ref}$ is a scalar value corresponding to magnetic field strength along the first axis during a time interval when no measurable object is present within a field of view corresponding to the extent of the sensor array,
$b2_{meas}$ is a scalar value corresponding to magnetic field strength along a second axis during a time interval when a measured object is present within a field of view corresponding to an extent of the sensor array,
$b2_{ref}$ is a scalar value corresponding to magnetic field strength along the second axis during a time interval when no measurable object is present within a field of view corresponding to the extent of the sensor array,
$b3_{meas}$ is a scalar value corresponding to magnetic field strength along a third axis during a time interval when a measured object is present within a field of view corresponding to an extent of the sensor array, and
$b3_{ref}$ is a scalar value corresponding to magnetic field strength along the third axis during a time interval when no measurable object is present within a field of view corresponding to the extent of the sensor array.

21. The method for generating an image corresponding to a magnetic field of claim 20, wherein the magnetic field analysis circuit includes a general purpose computer configured to execute a magnetic field analysis computer program.

22. The method for generating an image corresponding to a magnetic field of claim 20, further comprising:
magnetically shielding the plurality of magnetic sensors in the magnetic sensor array from a microcontroller that operates the magnetic sensors.

23. The method for generating an image corresponding to a magnetic field of claim 20, wherein operating the plurality of magnetic sensors in the magnetic sensor array includes sequentially measuring a local magnetic field coincident with each respective one of the plurality of magnetic sensors.

24. The method for generating an image corresponding to a magnetic field of claim 20, wherein operating the plurality of magnetic sensors in the magnetic array includes operating each of a plurality of sensor modules to sense respective local magnetic fields responsive to a magnetic field along at least three axes per sensor module.

25. The method for generating an image corresponding to a magnetic field of claim 24, wherein operating each of a plurality of sensor modules to sense respective local magnetic fields along at least three axes per sensor module includes measuring, for each sensor module and in each of three magnetic sensors on each sensor module, a change in electrical resistance between a fixed angle ferromagnetic layer and an induced angle ferromagnetic or paramagnetic layer; and
wherein an induced spin is responsive to a magnetic field strength coincident with each respective magnetic sensors along its corresponding axis.

26. The method for generating an image corresponding to a magnetic field of claim 20, wherein operating the plurality of magnetic sensors in the magnetic array includes operating a plurality of X-axis magnetic sensors, a plurality of Y-axis magnetic sensors, and a plurality of Z-axis magnetic sensors, and wherein the X-axis, the Z-axis, and the Y-axis are mutually substantially perpendicular.

27. The method for generating an image corresponding to a magnetic field of claim 26, wherein operating the plurality of magnetic sensors in the magnetic array includes operating equal numbers of X-axis magnetic sensors, Y-axis magnetic sensors, and Z-axis magnetic sensors.

28. The method for generating an image corresponding to a magnetic field of claim 26, wherein operating the plurality of magnetic sensors in the magnetic array includes operating unequal numbers of X-axis magnetic sensors, Y-axis magnetic sensors, and Z-axis magnetic sensors.

29. The method for generating an image corresponding to a magnetic field of claim 20, wherein operating the plurality of magnetic sensors in the magnetic array includes operating an application-specific integrated circuit (ASIC) or other programmable circuit configured to interface to a plurality of magnetic sensors corresponding to each of a plurality of sensor modules.

30. The method for generating an image corresponding to a magnetic field of claim 20, wherein operating a plurality of magnetic sensors in a magnetic sensor array includes operating a plurality of magnetic sensors arranged in sensor modules, each sensor module being configured to sense a local magnetic field on a plurality of sensing axes.

31. The method for generating an image corresponding to a magnetic field of claim 20, wherein operating a plurality of magnetic sensors in a magnetic sensor array includes operating a microcontroller to cause only one sensor module at a time to operate to sense a respective local magnetic field; and
suspending read and write operations with the microcontroller when a sensor module is operating.

32. The method for generating an image corresponding to a magnetic field of claim 31, wherein suspending read and write operations with the microcontroller when a sensor module is operating includes suspending read and write operations until an operating sensor module toggles an interface pin or until a timeout occurs.

33. The method for generating an image corresponding to a magnetic field of claim 20, wherein operating a plurality of magnetic sensors in a magnetic sensor array includes
operating magnetic sensors arranged in a 2×2 array size or greater array size of modules, with each module including multiple detection axes.

34. The method for generating an image corresponding to a magnetic field of claim 20, wherein generating, with the magnetic field analysis circuit, a magnetic field image corresponding to the plurality of data values includes, for each location in the magnetic sensor array, selecting at least one value corresponding to a magnetic field strength along one axis and using the selected value as input to the magnetic field image.

35. The method for generating an image corresponding to a magnetic field of claim 20, wherein generating, with the magnetic field analysis circuit, a magnetic field image corresponding to the plurality of data values includes, for each location in the magnetic sensor array, combining data values corresponding to a coincident magnetic field strength along a plurality of axes to determine a magnetic field strength independent of any one axis.

36. The method for generating an image corresponding to a magnetic field of claim 20, wherein generating, with the magnetic field analysis circuit, a magnetic field image corresponding to the plurality of data values includes, for each location in the magnetic sensor array, squaring a value corresponding to the magnetic field strength along each of three axes, summing the squares, and taking the square root of the sum of the squares;
wherein the square root of the sum of the squares represents a data value corresponding to a scalar magnetic field strength.

37. The method for generating an image corresponding to a magnetic field of claim 20 wherein the series of computer-executable instructions include floating point operations.

38. The method for generating an image corresponding to a magnetic field of claim 20, wherein generating, with the magnetic field analysis circuit, a magnetic field image corresponding to the plurality of data values consists essentially of generating a surface map.

39. The method for generating an image corresponding to a magnetic field of claim 20, wherein generating, with the magnetic field analysis circuit, a magnetic field image corresponding to the plurality of data values consists essentially of generating a heat map.

40. The method for generating an image corresponding to a magnetic field of claim 20, wherein generating, with the magnetic field analysis circuit, a magnetic field image corresponding to the plurality of data values includes generating a heat map superimposed on a surface map or generating a surface map superimposed over a heat map.

41. The method for generating an image corresponding to a magnetic field of claim 20, wherein generating, with the magnetic field analysis circuit, a magnetic field image corresponding to the plurality of data values includes interpolating magnetic field strengths corresponding to locations between the magnetic sensors.

42. The method for generating an image corresponding to a magnetic field of claim 20, wherein generating, with the magnetic field analysis circuit, a magnetic field image corresponding to the plurality of data values includes executing a spline function responsive to the data values or a function of the data values.

43. The method for generating an image corresponding to a magnetic field of claim 20, further comprising:
 operating a visible light, ultraviolet light, or infrared light imager to capture an image of a near-field object that generates the magnetic field or magnetic fields.

44. The method for generating an image corresponding to a magnetic field of claim 43, further comprising: correlating one or more features of the image of the near-field object to the magnetic field or magnetic fields.

45. The method for generating an image corresponding to a magnetic field of claim 43, wherein the imager is registered to the magnetic sensor array and operatively coupled to the magnetic field analysis circuit.

46. The method for generating an image corresponding to a magnetic field of claim 43, wherein outputting the magnetic field image as the image corresponding to the magnetic field includes outputting a magnetic field image registered to a visible light, ultraviolet light, or infrared light image produced by the visible light, ultraviolet light, or infrared light imager.

* * * * *